United States Patent
Kologe et al.

(10) Patent No.: US 6,783,690 B2
(45) Date of Patent: Aug. 31, 2004

(54) METHOD OF STRIPPING SILVER FROM A PRINTED CIRCUIT BOARD

(76) Inventors: Donna M. Kologe, 56 Woodruff Ave., Thomaston, CT (US) 06787; Raymond A. Letize, 47 Linwood St., West Haven, CT (US) 06516; Brian Larson, 1310 Avon Blvd., Cheshire, CT (US) 06410

( * ) Notice: Subject to any disclaimer, the term of this patent is extended or adjusted under 35 U.S.C. 154(b) by 57 days.

(21) Appl. No.: 10/106,522

(22) Filed: Mar. 25, 2002

(65) Prior Publication Data

US 2003/0183598 A1 Oct. 2, 2003

(51) Int. Cl.$^7$ .............................. C23F 1/00; C09K 13/00
(52) U.S. Cl. ....................... 216/100; 216/13; 252/79.5; 427/307; 174/250
(58) Field of Search .................. 216/100, 13; 252/79.5; 427/307; 174/250

(56) References Cited

U.S. PATENT DOCUMENTS

| | | | |
|---|---|---|---|
| 3,615,950 A | * | 10/1971 | Lacal ........................ 216/108 |
| 3,860,423 A | | 1/1975 | Okamoto |
| 4,204,013 A | | 5/1980 | Arcilesi et al. |
| 4,448,637 A | | 5/1984 | Hiraishi et al. |
| 4,960,490 A | | 10/1990 | Berg et al. |
| 5,002,649 A | | 3/1991 | Smith |
| H1136 H | | 2/1993 | Janikowski |
| 5,245,111 A | | 9/1993 | Betz |
| 5,611,905 A | * | 3/1997 | Florio et al. ................ 205/109 |
| 6,126,720 A | | 10/2000 | Okada et al. |
| 6,200,451 B1 | | 3/2001 | Redline et al. |
| 6,221,520 B1 | * | 4/2001 | Takaki et al. ............... 428/699 |
| 6,238,592 B1 | | 5/2001 | Hardy et al. |

FOREIGN PATENT DOCUMENTS

JP  407316845 A  * 12/1995 ............. C23F/1/14

* cited by examiner

Primary Examiner—Nadine G. Norton
Assistant Examiner—Shamim Ahmed
(74) Attorney, Agent, or Firm—Carmody & Torrance, LLP

(57) ABSTRACT

A method of stripping silver from a printed circuit board without attacking the underlying base metal. The stripping solution comprises an oxidizing agent, an alkaline pH adjuster, and a silver solubilizing agent. After the silver has been sufficiently removed from the surface of the printed circuit board, the printed circuit board is contacted with a neutralization solution to remove any smut remaining on the surface. The silver stripping solution does not contain cyanide or chromium and does not require the use of anodic current.

8 Claims, No Drawings

METHOD OF STRIPPING SILVER FROM A PRINTED CIRCUIT BOARD

FIELD OF THE INVENTION

This invention relates to a method of treating a printed circuit board to chemically remove plated silver from a printed circuit board without the use of harmful chemicals or the application of external current.

BACKGROUND OF THE INVENTION

In the manufacture of electronic equipment utilizing printed circuits, connections of electronic components to the printed circuits are made by soldering of the leads of the components to the through-holes, surrounding pads, lands, and other points of connections.

To facilitate this soldering operation, the printed circuit fabricator is required to arrange that the through-holes, pads, lands, and other points of connection are receptive to the subsequent soldering processes. Thus, these surfaces must be readily wettable by the solder and permit an integral conductive connection with the leads or surfaces of the electronic components. Because of these needs, printed circuit fabricators have devised various methods of preserving and enhancing the solderability of surfaces.

Soldering directly to copper surfaces has been difficult and inconsistent. These problems are due mainly to the inability of keeping the copper surfaces clean and free of oxidation throughout the soldering operation. Immersion silver deposits have been found to provide excellent solderability preservatives, which are particularly useful in the fabrication of printed circuit boards. The soluble source of silver ions can be derived from a variety of silver compounds. An example of a silver immersion plating process can be found in U.S. Pat. No. 6,200,451, to Redline et al., the subject matter of which is hereby incorporated by reference. The immersion silver solution is used to plate a thin layer of silver onto the surface to be soldered. The resultant silver coating is generally between 1 and 100 micro-inches in thickness for effective enhancement and preservation of the solderability of the surface.

In general, an immersion plating process results from a replacement reaction whereby the surface being plated dissolves into solution and at the same time the metal being plated deposits from the plating solution onto the surface. The immersion plating initiates without prior activation of the surfaces. The metal to be plated is generally more noble that the surface metal. Thus, immersion plating is usually significantly easier to control and significantly more cost effective than electroless plating, which requires sophisticated auto catalytic plating solutions and processes for activation of the surfaces prior to plating.

In the course of fabricating a printed circuit board, it may also be necessary to afterwards strip the silver from all or selected copper, or other metal, surfaces over which it was deposited. This need arises, for example, where it is necessary to plate another metal, such as nickel or gold, directly over the copper at certain portions of the board, or where it is desired to apply a solder mask over certain bare copper surfaces. It also may be necessary to strip silver from the copper layer in the course of treating a reject piece in order to recover and reuse the underlying copper material.

It is well known in the art of stripping silver to use chemicals such as cyanides, chromates, and strong acid solutions to facilitate the removal of silver from the surface of a substrate. In addition it is well known to use an anodic current to facilitate the removal of silver, with or without the use of such chemicals.

Examples of useful silver strippers are inhibited acid or cyanide solutions. The acids include sulfuric and sulfonic acids and other mineral acids useful in metal stripping compositions. The cyanide stripper compositions include alkali or alkaline earth metals or ammonium cyanide stripping compositions known to those in the art. The inhibited compositions typically are inhibited by nitrocompounds. Examples of useful inhibiting compounds include nitrobenzenes, nitrobenzoic acids, nitrobenzaldehydes, nitroparafins, and nitroalkanes.

While these methods do facilitate the removal of plated silver, these methods are unacceptable due to environmental concerns relating to the use of cyanide or chromate. The chemicals used in the prior art also have a tendency to attack the underlying solder mask or substrate. In addition, there may be an inability, when using an anodic current, to apply current across the entirety of the printed circuit board.

U.S. Statutory Invention Registration H1,136, to Janikowski, the subject matter of which is hereby incorporated by reference, discloses a method for electroplating silver which comprises a plating solution and/or stripping solution of an alkali hydroxide and ethylenediamine. While the plating and/or stripping solution does not contain cyanide, the process of the invention does require an anodic current.

Likewise, U.S. Pat. No. 5,002,649, to Smith, the subject matter of which is hereby incorporated by reference, discloses an apparatus for electrolytically or chemically stripping plating material, including silver plating, from a selected surface. The apparatus requires anodic current, although the stripping can be accomplished either electrolytically or chemically. In addition, the chemical stripping solution may contain cyanide.

The method of the present invention provides a new stripping solution for removing silver that does not contain any of the more toxic chemicals of prior art stripping solutions or require the use of an anodic current to facilitate removal of the plated silver. In addition, the silver stripping solution of the present invention does not attack either the base metal to which the silver is plated or the solder mask. The method provides an inventive stripping solution to chemically remove plated silver from printed circuit boards without the problems inherently found in the prior art.

SUMMARY OF THE INVENTION

The present invention relates to a method of stripping silver from a printed circuit board without attacking the underlying base metal. Another benefit of the method of the present invention is its ability to selectively remove silver without attacking the solder mask.

The present invention comprises a method for removing plated silver from a printed circuit board comprising the steps of:

(a) contacting said printed circuit board with a stripping solution comprising an oxidizing agent, an alkaline pH adjuster, and a silver solubilizing agent; and (b) neutralizing said printed circuit board with a neutralization solution.

DETAILED DESCRIPTION OF THE INVENTION

The printed circuit board is coated with a base metal such as copper, nickel or gold on which the silver is plated. The silver stripping composition of the present invention is formulated so as to strip the plated silver while not attacking the base metal to which the silver is plated. This is especially important with the tight tolerances and thickness specifications required by printed circuit board manufacturing. The chemistry of the stripping solution is such that the solution selectively removes silver without attacking the solder mask. In addition, there is no evidence of adhesion loss or lifting, bleaching or fading of substrate, or leaching of the solder mask after processing is completed.

The stripping solution of the present invention comprises a strong oxidizing agent, an alkaline pH adjuster, and a silver solubilizing agent. Suitable strong oxidizing agents for use in the invention include potassium permanganate, sodium permanganate, sodium or potassium chlorite and sodium or potassium chlorate. Sodium or potassium permanganate are preferred. The pH adjuster is generally a hydroxide, such as sodium hydroxide or potassium hydroxide. Suitable silver solubilizing agents for use in the invention include succinimide and ammonia (ammonium hydroxide) or other sources of ammonium ions. In addition, other optional ingredients that may be present in the stripping solution of the present invention include ammonium carbonate and ammonium bicarbonate.

The oxidizing agent is preferably present in the solution at a concentration between 1 and 30 grams/liter. The alkaline pH adjuster is preferably present at a concentration between 7 and 25 grams/liter and is of a sufficient quantity to maintain the pH between 11 and 13.5, preferably between 12.5 and 13.5. The silver solubilizing agent is preferably present in the solution at a concentration between 1 and 5 grams/liter. The optional ingredients, if used, are present in the stripping solution at a concentration between 2 and 15 grams/liter.

The printed circuit board is contacted with the stripping solution by immersing the printed circuit board into the solution for a period of 5 minutes. The stripping solution is generally heated to a temperature within the range of 95° F. and 115° F. The progress of the stripping can be followed by periodic visual inspections or by measuring weight loss of the substrate at periodic intervals.

Once the silver has been sufficiently removed from the surface, the printed circuit board is subjected to a standard neutralization step to remove any smut remaining on the substrate from the silver stripping. The printed circuit board is contacted with a neutralization solution, which solution preferably contains hydroxyl amine sulfate and sulfuric acid.

What is claimed is:

1. A method for removing plated silver from a printed circuit board comprising circuit traces of a base metal covered, at least in part, by a plated silver deposit, said method comprising the steps of:

(a) contacting said printed circuit board with a stripping solution comprising and oxidizing agent, an alkaline pH adjuster, and a silver solubilizing agent; and (b) neutralizing said printed circuit board with a neutralization solution wherein the stripping solution does not contain a source of cyanide ions and wherein the oxidizing agent is selected from the group consisting of sodium permanganate potassium permanganate, sodium chlorite, potassium chlorite, sodium chlorite and potassium chlorite and the solubilizing agent is selected from the group consisting of succinimide and sources of ammonium ions.

2. A method according to claim 1, wherein steps (a) and (b) and repeated.

3. A method according to claim 1, wherein said oxidizing agent and potassium permanganate.

4. A method according to claim 1, wherein said alkaline pH adjuster is sodium hydroxide.

5. A method according to claim 1, wherein said silver solubilizing agent is selected from the group consisting of succinimide and ammonia.

6. A method according to claim 1, wherein said neutralization solution comprises hydroxyl amine sulfate and sulfuric acid.

7. A method according to claim 1, wherein said base metal is selected from the group consisting of copper, nickel, and gold.

8. A method according to claim 1, wherein said stripping solution further comprises ammonium carbonate or ammonium bicarbonate.

* * * * *

UNITED STATES PATENT AND TRADEMARK OFFICE
CERTIFICATE OF CORRECTION

PATENT NO.    : 6,783,690 B2
DATED         : August 31, 2004
INVENTOR(S)   : Donna M. Kologe et al.

It is certified that error appears in the above-identified patent and that said Letters Patent is hereby corrected as shown below:

<u>Column 4,</u>
Line 11, between "comprising" and "oxidizing," delete the word "and" and replace it with -- an --
Line 23, between "(b)" and "repeated," delete the word "and" and replace it with -- are --
Line 25, between "agent" and "potassium," delete the word "and" and replace it with --is --

Signed and Sealed this

Thirtieth Day of November, 2004

JON W. DUDAS
*Director of the United States Patent and Trademark Office*